United States Patent [19]
Egawa

[11] Patent Number: 6,118,305
[45] Date of Patent: Sep. 12, 2000

[54] SEMICONDUCTOR INTEGRATED CIRCUIT CAPABLE OF PREVENTING BREAKDOWN OF A GATE OXIDE FILM

[75] Inventor: Kumi Egawa, Kanagawa, Japan

[73] Assignee: NEC Corporation, Tokyo, Japan

[21] Appl. No.: 08/927,811

[22] Filed: Sep. 12, 1997

[30] Foreign Application Priority Data

Sep. 12, 1996 [JP] Japan ..................................... 8-242305

[51] Int. Cl.⁷ .............................................. H03K 19/094
[52] U.S. Cl. ................. 326/112; 326/55; 326/57
[58] Field of Search ....................... 326/56–58, 101–103, 326/112, 119, 121

[56] References Cited

U.S. PATENT DOCUMENTS

| | | | |
|---|---|---|---|
| 3,982,138 | 9/1976 | Luisi et al. | 326/103 |
| 4,918,336 | 4/1990 | Graham et al. | 326/57 |
| 5,099,148 | 3/1992 | McClure et al. | 326/86 |
| 5,774,000 | 6/1998 | Vercellotti et al. | 327/110 |
| 5,828,235 | 10/1998 | Horiguchi et al. | 326/121 |

FOREIGN PATENT DOCUMENTS

| | | |
|---|---|---|
| 49-79159 | 10/1947 | Japan . |
| 51-40082 | 4/1976 | Japan . |
| 52-132685 | 11/1977 | Japan . |
| 59-145560 | 8/1984 | Japan . |
| 2-199850 | 8/1990 | Japan . |
| 2-202053 | 8/1990 | Japan . |

*Primary Examiner*—Michael Tokar
*Assistant Examiner*—Don Phu Le
*Attorney, Agent, or Firm*—Young & Thompson

[57] ABSTRACT

The present invention provides a semiconductor integrated circuit comprising a plurality of logic circuits, each of which has at least a first field effect transistor with a first gate connected to a high voltage line and at least a second field effect transistor with a second gate connected to a ground line, wherein said first gates of said plurality of logic circuits are commonly connected through a first interconnection structure to a first resistance which is connected to said high voltage line and wherein said second gates of said plurality of logic circuits are also commonly connected through a second interconnection structure to a second resistance which is connected to said ground line. The first and second interconnection structures enable the single first resistance and the single second resistance to prevent the gate breakdown of the gates in the plurality of the logic circuits. The semiconductor integrated circuit needs a small area for placement of only the two resistances or the first and second resistances in order to prevent the breakdown of the gates of all of the plural logic circuits.

3 Claims, 12 Drawing Sheets

SEMICONDUCTOR INTEGRATED CIRCUIT CAPABLE OF PREVENTING BREAKDOWN OF A GATE OXIDE FILM

BACKGROUND OF THE INVENTION

The present invention relates to a semiconductor integrated circuit, and more particularly to a semiconductor integrated circuit capable of preventing breakdown of a gate oxide film of a MOS field effect transistor.

In the semiconductor integrated circuit, a gate voltage of a MOS field effect transistor is clamped at a power voltage level or the ground level. If the gate of the MOS field effect transistor is directly connected to a power source or a ground line, then static electricity or noises apply a voltage directly to the gate of the MOS field effect transistor whereby breakdown of a gate insulation film of the MOS field effect transistor may appear.

FIG. 1 is a view illustrative of the conventional semiconductor integrated circuit including a plurality of logic circuits D1–Dn and a plurality of circuits E1–Em. FIG. 2 is a circuit diagram of each of the logic circuits D1–Dn. Each logic circuit has a p-channel MOS field effect transistor T1 with a gate which is connected through a resistance 71 to the ground line. The p-channel MOS field effect transistor T1 is kept in ON state. Each logic circuit also has an n-channel MOS field effect transistor T2 with a gate which is connected through a resistance 72 to a high voltage line Vcc whereby the n-channel MOS field effect transistor T2 is kept in ON state. Each logic circuit also has a p-channel MOS field effect transistor T3 with a gate connected to a first terminal C1. Each logic circuit also has an n-channel MOS field effect transistor T4 with a gate connected to the first terminal C1 so that the gate of the n-channel MOS field effect transistor T4 has the same potential as the voltage of the gate of the p-channel MOS field effect transistor T3. Each logic circuit also has a p-channel MOS field effect transistor T5 with a gate connected to a third terminal C3. Each logic circuit also has an n-channel MOS field effect transistor T6 with a gate connected to the third terminal C3 so that the gate of the n-channel MOS field effect transistor T6 has the same potential as the voltage of the gate of the p-channel MOS field effect transistor T5. Each logic circuit also has an n-channel MOS field effect transistor T8. A gate of the n-channel MOS field effect transistor T8 is connected to an output terminal of an invertor 3. A drain of the n-channel MOS field effect transistor T8 is connected to a drain of the n-channel MOS field effect transistor T4. A source of the n-channel MOS field effect transistor T8 is connected to a drain of an n-channel MOS field effect transistor T9. The invertor 3 has an input terminal connected to a second terminal C2. A gate of the n-channel MOS field effect transistor T9 is connected to the third terminal C3 so that the gate of the n-channel MOS field effect transistor T9 has the same potential as the gate of the n-channel MOS field effect transistor T6.

The following description will focus on operations of the above individual integrated circuit. The description will be made with reference to FIG. 2. The p-channel MOS field effect transistor T1 is kept in ON state since the gate of the p-channel MOS field effect transistor T1 is connected through the resistance 71 to the ground line. The n-channel MOS field effect transistor T2 is kept in ON state since the gate of the n-channel MOS field effect transistor T2 is connected through the resistance 72 to the high voltage line Vcc. The n-channel and p-channel MOS field effect transistors T1 and T2 provide no effect to the operations of the integrated circuit.

When a first input signal to be applied to the first terminal C1 is high level, then the p-channel MOS field effect transistor T3 turns OFF whilst the n-channel MOS field effect transistor T4 turns ON whereby an output terminal C4 is conductive to the ground line. As a result, a low level output signal appears on the output terminal C4 regardless of second and third input signals to be inputted into the second and third input terminals C2 and C3.

Also if a third input signal to be applied to the third terminal C3 is high level, then the p-channel MOS field effect transistor T5 turns OFF whilst the n-channel MOS field effect transistor T6 turns ON and also the n-channel MOS field effect transistor T6 is kept in ON state whereby the output terminal C4 is conductive to the ground line. As a result, a low level output signal appears on the output terminal C4 regardless of the first and second input signals to be inputted into the first and second input terminals C1 and C2.

If the first and third input signals to be inputted into the first and third input terminals are the low level, then the p-channel MOS field effect transistor T1 is kept in ON state and the p-channel MOS field effect transistors T3 and T5 turn ON whilst the n-channel MOS field effect transistors T4 and T6 turn OFF whereby the output terminal C4 is conductive to the high voltage line Vcc. As a result, the high level signal appears on the output terminal C4.

From the above descriptions, the integrated circuits D1–Dn are two-input OR gates.

If the second input signal to be inputted into the second input terminal is high level, then an output signal from the invertor 3 is low level whereby the n-channel MOS field effect transistor T8 turns OFF. As a result, ON/OFF operations of the n-channel MOS field effect transistor T9 provide no effect to the operations of the integrated circuit.

If the second input signal to be inputted into the second input terminal C2 is low level whilst the third input signal to be inputted into the third input terminal C3 is high level, then the n-channel MOS field effect transistors T6 and T9 turn ON concurrently whereby the majority of the current flows through the n-channel MOS field effect transistor T6. Namely, if the second input signal to be inputted into the second input terminal C2 is low level, then a logic threshold voltage of the OR gate is dropped where the logic threshold voltage is a threshold voltage of whether the OR gate turns ON or OFF by the third input signal inputted into the third input signal terminal C3.

The following descriptions will focus on the integrated circuits E1–Em. The descriptions will be made with reference to FIG. 3. Each of the integrated circuits E1–Em has an input terminal C5 and an output terminal C6 and also is supplied with a power through a high voltage line Vcc. Each logic circuit has an invertor 6 with an output terminal connected to the output terminal C6. Each logic circuit has an EXOR gate 5 with an output terminal connected to an input terminal of the invertor 6. The input terminal C5 is connected to one of input terminals of the EXOR gate 5. Each logic circuit has an invertor 4 with an output terminal connected to the other one of the input terminals of the EXOR gate 5. An input terminal of the invertor 4 is connected through a resistance 73 to the high voltage line Vcc. The invertor 4 has MOS field effect transistors. The resistance 73 prevents the gate breakdown of the MOS field effect transistors in the invertor 4.

The following descriptions will focus on the operations of the above integrated circuits E1–Em. Since the input terminal of the invertor 4 is connected through the resistance 73 to the high voltage line Vcc, then the output signal from the invertor 4 is kept in low level. The output signal from the invertor 4 is inputted into the one input terminal of the EXOR gate 5. As a result, the one input terminal of the EXOR gate 5 is kept to receive the low level signal, for which reason the output signal from the EXOR gate 5 depends upon the signal inputted to the input terminal C5. Namely, if the input signal inputted through the input terminal C5 is low level, then the output signal from the EXOR gate 5 is high level. If, however, the input signal inputted through the input terminal C5 is low level, then the output signal from the EXOR gate 5 is high level. The output terminal of the EXOR gate 5 is connected through the invertor 6 to the output terminal C6. Therefore, if the input signal inputted through the input terminal C5 is low level, the low level output signal appears on the output terminal C6. If, however, the input signal inputted through the input terminal C5 is high level, the high level output signal appears on the output terminal C6. Namely, the integrated circuits E1–Em serve as buffer circuits.

As described above, the resistances 71, 72 and 73 serve to prevent the gate breakdown. The circuits D1–Dn have 2n of the resistances whilst the circuits E1–Em have m of the resistances. In order to form the resistance of 1 kΩ, 2070 $\mu m^2$ is necessary in case of diffusion resistance or 870 $\mu m^2$ is necessary in case of polysilicon resistance.

As the scale of the semiconductor integrated circuits will become large in future, the number of the MOS field effect transistors used is increased whereby the necessary area for placing the resistances is also increased. This results in the increase in area of the semiconductor chip.

Under the above circumstances, it had been required to develop the semiconductor integrated circuits capable of preventing the gate breakdown without any substantive increase in area for placement of the resistances on the semiconductor chip.

SUMMARY OF THE INVENTION

Accordingly, it is a primary object of the present invention to provide a novel semiconductor integrated circuit capable of preventing the gate breakdown without any substantive increase in area for placement of resistances on the semiconductor chip.

The above and other objects, features and advantages of the present invention will be apparent from the following descriptions.

The present invention provides a semiconductor integrated circuit comprising a plurality of logic circuits, each of which has at least a first field effect transistor with a first gate connected to a high voltage line and at least a second field effect transistor with a second gate connected to a ground line, wherein said first gates of said plurality of logic circuits are commonly connected through a first interconnection structure to a first resistance which is connected to said high voltage line and wherein said second gates of said plurality of logic circuits are also commonly connected through a second interconnection structure to a second resistance which is connected to said ground line. The first and second interconnection structures enable the single first resistance and the single second resistance to prevent the gate breakdown of the gates in the plurality of the logic circuits. The semiconductor integrated circuit needs a small area for placement of only the two resistances or the first and second resistances in order to prevent the breakdown of the gates of all of the plural logic circuits.

BRIEF DESCRIPTIONS OF THE DRAWINGS

Preferred embodiments of the present invention will be described in detail with reference to the accompanying drawings.

DISCLOSURE OF THE INVENTION

Figure 1:
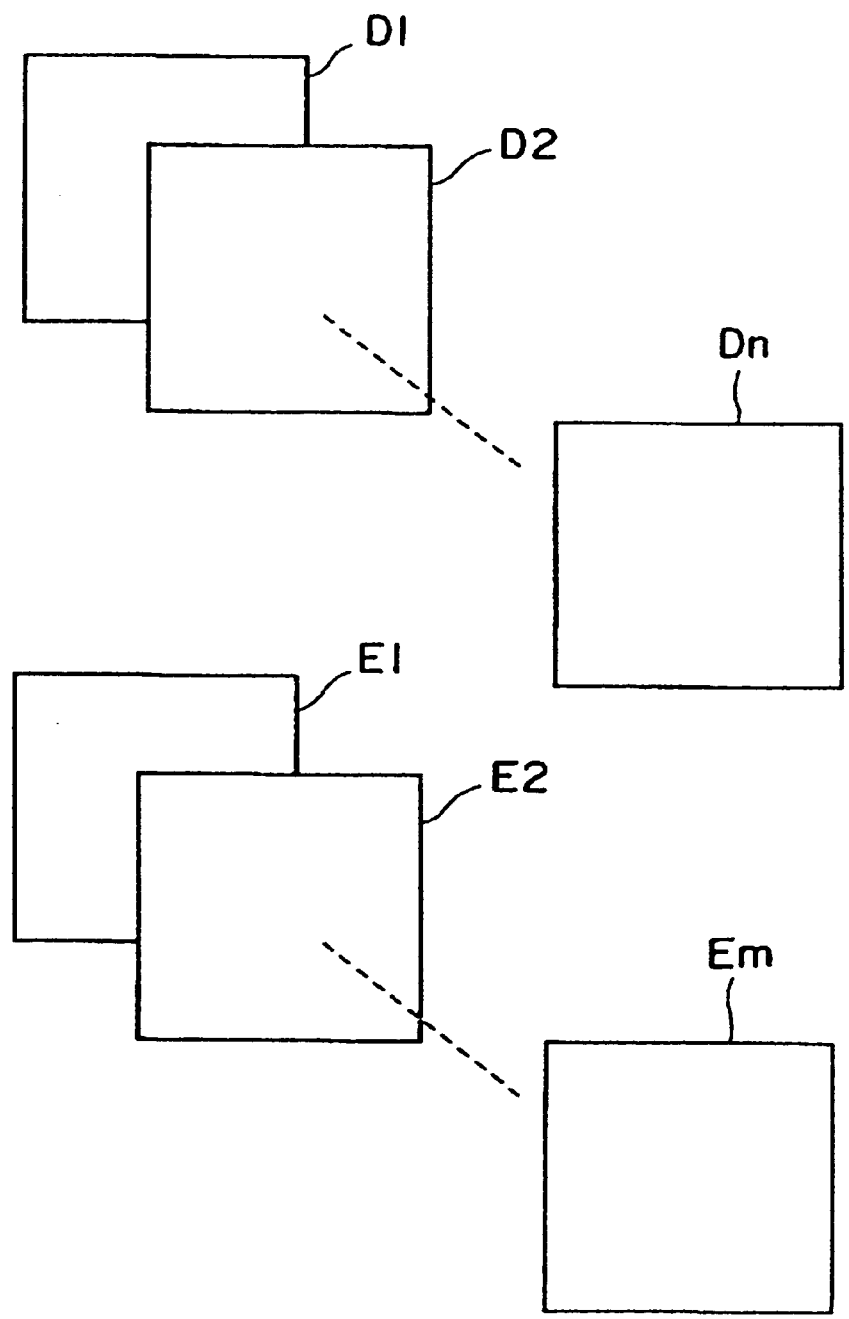
FIG. 1 is a view illustrative of the conventional semiconductor integrated circuit including a plurality of logic circuits D1–Dn and a plurality of circuits E1–Em.
Figure 2:
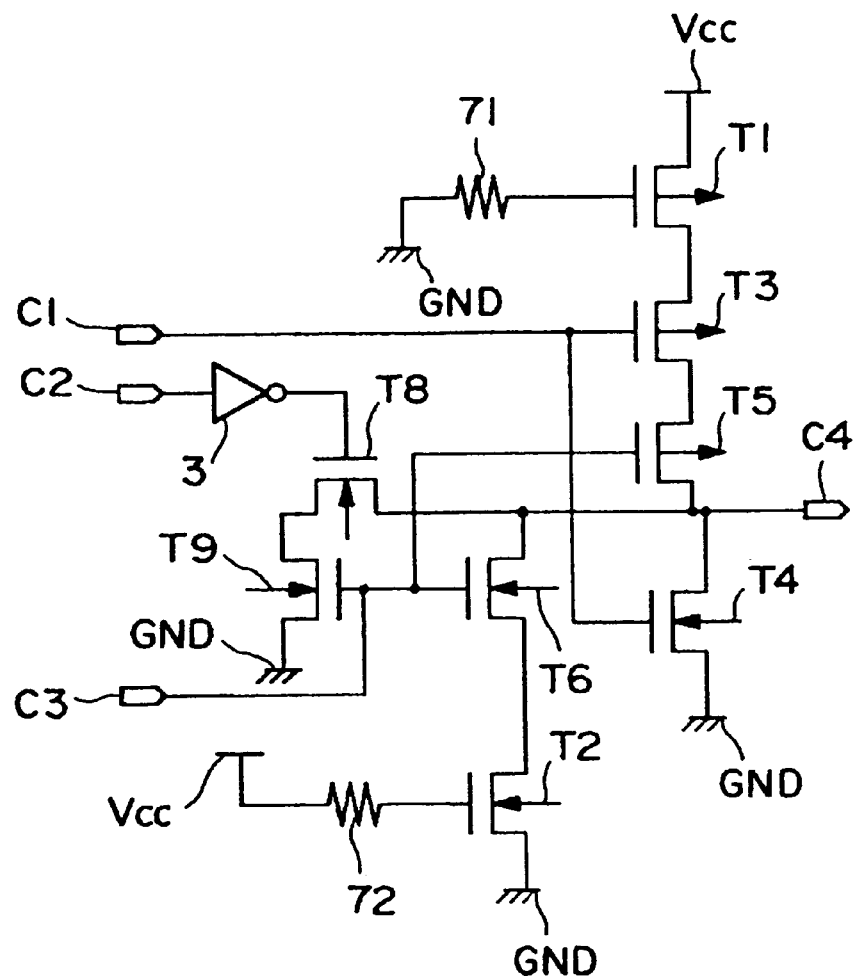
FIG. 2 is a circuit diagram of each of the logic circuits D1–Dn in FIG. 1.
Figure 3:
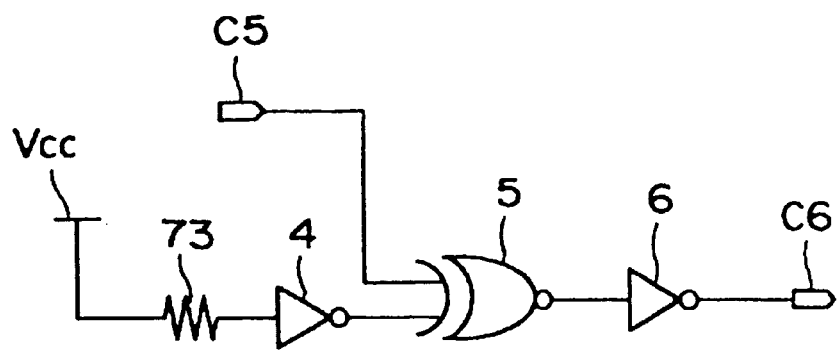
FIG. 3 is a circuit diagram of each of the logic circuits E1–Em in FIG. 1.

The present invention provides a semiconductor integrated circuit comprising a plurality of logic circuits. Each of the logic circuits has both at least a first field effect transistor with a first gate connected to a first constant voltage line applied with a first constant voltage and at least a second field effect transistor with a second gate connected to a second constant voltage line applied with a first constant voltage, wherein the first gates of at least two of the plurality of logic circuits are commonly connected through a first interconnection structure to a first resistance which is connected to the first constant voltage line, and wherein the second gates of at least two of the plurality of logic circuits are also commonly connected through a second interconnection structure to a second resistance which is connected to the second constant voltage line. The first and second interconnection structures enable the single first resistance and the single second resistance to prevent the gate breakdown of the gates in the plurality of the logic circuits. The semiconductor integrated circuit needs a small area for placement of only the two resistances or the first and second resistances in order to prevent the breakdown of the gates of all of the plural logic circuits. Since the gates of a plurality of the field effect transistors are commonly connected to the single resistance, then the capacitance connected to the resistance is increased whereby the effect for prevention of the gate breakdown is improved.

It is also preferable that the first gates of all of the plurality of logic circuits are commonly connected through a first interconnection structure to a first resistance which is connected to the first constant voltage line, and wherein the second gates of all of the plurality of logic circuits are also commonly connected through a second interconnection structure to a second resistance which is connected to the second constant voltage line. Since the gates of all of the field effect transistors are commonly connected to the single resistance, then the capacitance connected to the resistance is increased whereby the effect for prevention of the gate breakdown is maximally improved.

It is also preferable that the plurality of logic circuits form a plurality of groups and the first interconnection structure is divided into a plurality of first subordinate interconnection structures in correspondence to the plurality of groups as well as the first resistance comprises a plurality of first subordinate resistances in correspondence to the plurality of first subordinate interconnection structures which are connected in parallel to the first constant voltage line, so that the first gates of the logic circuits in each of the plurality of groups are commonly connected through a corresponding one of the plurality of first subordinate interconnection structures to a corresponding one of the plurality of first subordinate resistances. Since the gates of part of the field effect transistors are commonly connected to the single resistance, then the capacitance connected to the resistance is increased whereby the effect for prevention of the gate breakdown is improved with increased freedom in design of circuit configuration.

It is also preferable that the plurality of logic circuits form a plurality of groups and the second interconnection structure is divided into a plurality of second subordinate interconnection structures in correspondence to the plurality of groups as well as the second resistance comprises a plurality of second subordinate resistances in correspondence to the plurality of second subordinate interconnection structures which are connected in parallel to the second constant voltage line, so that the second gates of the logic circuits in each of the plurality of groups are commonly connected through a corresponding one of the plurality of second subordinate interconnection structures to a corresponding one of the plurality of second subordinate resistances. Since the gates of part of the field effect transistors are commonly connected to the single resistance, then the capacitance connected to the resistance is increased whereby the effect for prevention of the gate breakdown is improved with increased freedom in design of circuit configuration.

It is also preferable that the first resistance comprises a diffusion layer which is isolated by an insulation film from a semiconductor substrate on which the plurality of logic circuits are formed. A capacitance is formed between the diffusion layer and the semiconductor substrate and this capacitance improves the capability of prevention of the gate breakdown.

It is also preferable that the second resistance comprises a diffusion layer which is isolated by an insulation film from a semiconductor substrate on which the plurality of logic circuits are formed. A capacitance is formed between the diffusion layer and the semiconductor substrate and this capacitance improves the capability of prevention of the gate breakdown.

It is also preferable that the first resistance comprises a diffusion layer having a first conductivity type and being formed on a semiconductor substrate having a second conductivity type on which the plurality of logic circuits are formed. A capacitance is formed between the diffusion layer and the semiconductor substrate and this capacitance improves the capability of prevention of the gate breakdown.

It is also preferable that the second resistance comprises a diffusion layer having a first conductivity type and being formed on a semiconductor substrate having a second conductivity type on which the plurality of logic circuits are formed. A capacitance is formed between the diffusion layer and the semiconductor substrate and this capacitance improves the capability of prevention of the gate breakdown.

It is also preferable that the first resistance comprises a polysilicon layer which is isolated by an insulation film from a semiconductor substrate on which the plurality of logic circuits are formed. A capacitance is formed between the polysilicon layer and the semiconductor substrate and this capacitance improves the capability of prevention of the gate breakdown.

It is also preferable that the second resistance comprises a polysilicon layer which is isolated by an insulation film from a semiconductor substrate on which the plurality of logic circuits are formed. A capacitance is formed between the polysilicon layer and the semiconductor substrate and this capacitance improves the capability of prevention of the gate breakdown.

It is also preferable that the first gate is a p-channel gate and the second gate is an n-channel gate and that the first constant voltage line is a high voltage line applied with a power voltage whilst the second constant voltage line is a ground line applied with a ground level voltage.

PREFERRED EMBODIMENTS
FIRST EMBODIMENT

A first embodiment according to the present invention will be described with reference to FIGS. 4, 5, 6, 7, 8, 9, 10 and 15. A novel semiconductor integrated circuit in a first embodiment according to the present invention comprises logic circuits A1–An and B1–Bm, each of which has a plurality of field effect transistors with gates connected to a high voltage line Vcc and field effect transistors with other gates connected to a ground line GND. The gates of the logic circuits A1–An and B1–Bm are commonly connected through a first interconnection structure GR to a first resistance 1 which is connected to the ground line GND. The other gates of the logic circuits A1–An and B1–Bm are also commonly connected through a second interconnection structure VR to a second resistance 2 which is connected to the high voltage line Vcc. A power is supplied through the high voltage line Vcc to the individual logic circuits A1–An and B1–Bm. The first and second interconnection structures GR and VR enable the single first resistance 1 and the single second resistance 2 to prevent the gate breakdown of the field effect transistors in the plurality of the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

Figure 4:
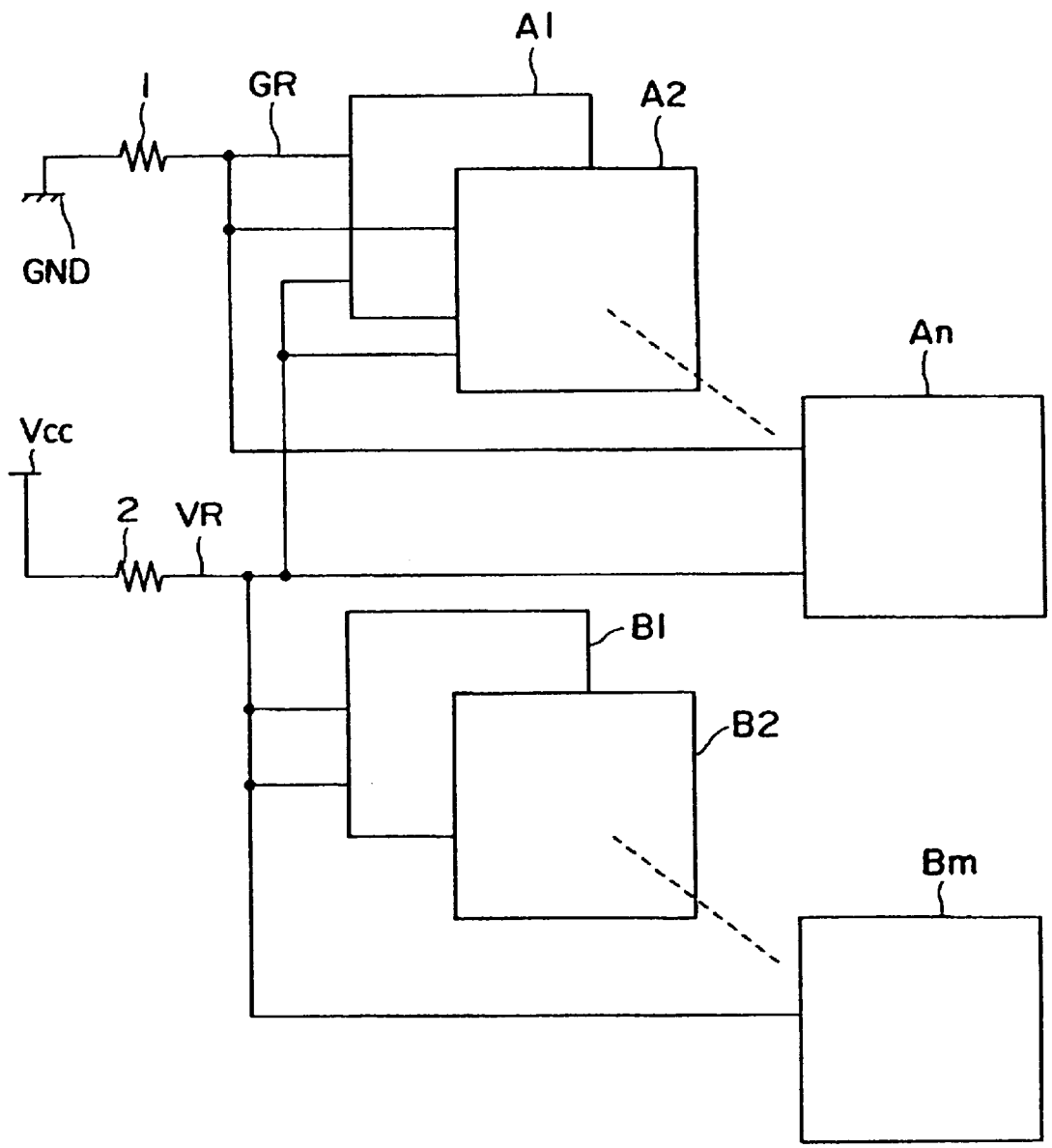
FIG. 4 is a view illustrative of a novel semiconductor integrated circuit including a plurality of logic circuits D1–Dn and a plurality of circuits E1–Em in accordance with the present invention.
Figure 5:
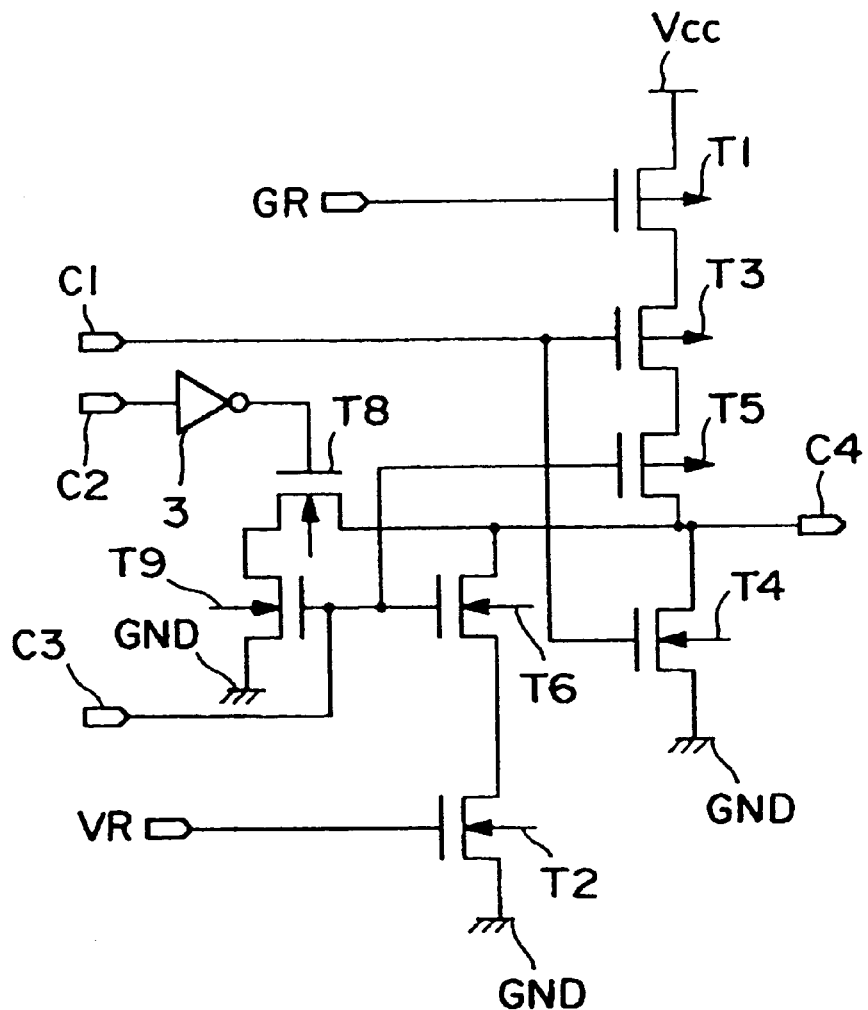
FIG. 5 is a circuit diagram of each of the logic circuits A1–An in FIG. 4.

FIG. 5 is a circuit diagram of each of the logic circuits A1–An in FIG. 4. Each logic circuit has a p-channel MOS field effect transistor T1 with a gate which is connected through the first interconnection structure GR to the first resistance 1. The p-channel MOS field effect transistor T1 is kept in ON state. Each logic circuit also has an n-channel MOS field effect transistor T2 with a gate which is connected through a second interconnection structure VR to a second resistance 2 whereby the n-channel MOS field effect transistor T2 is kept in ON state. Each logic circuit also has a p-channel MOS field effect transistor T3 with a gate connected to a first terminal C1. Each logic circuit also has an n-channel MOS field effect transistor T4 with a gate connected to the first terminal C1 so that the gate of the n-channel MOS field effect transistor T4 has the same potential as the voltage of the gate of the p-channel MOS field effect transistor T3. Each logic circuit also has a p-channel MOS field effect transistor T5 with a gate connected to a third terminal C3. Each logic circuit also has an n-channel MOS field effect transistor T6 with a gate connected to the third terminal C3 so that the gate of the n-channel MOS field effect transistor T6 has the same potential as the voltage of the gate of the p-channel MOS field effect transistor T5. Each logic circuit also has an n-channel MOS field effect transistor T8. A gate of the n-channel MOS field effect transistor T8 is connected to an output terminal of an invertor 3. A drain of the n-channel MOS field effect transistor T8 is connected to a drain of the n-channel MOS field effect transistor T4. A source of the n-channel MOS field effect transistor T8 is connected to a drain of an n-channel MOS field effect transistor T9. The invertor 3 has an input terminal connected to a second terminal C2. A gate of the n-channel MOS field effect transistor T9 is connected to the third terminal C3 so that the gate of the n-channel MOS field effect transistor T9 has the same potential as the gate of the n-channel MOS field effect transistor T6.

The following description will focus on operations of the above individual integrated circuit. The description will be made with reference to FIG. 5. The p-channel MOS field effect transistor T1 is kept in ON state since the gate of the p-channel MOS field effect transistor T1 is connected to the resistance 1 through the first interconnection structure GR. The n-channel MOS field effect transistor T2 is kept in ON state since the gate of the n-channel MOS field effect transistor T2 is connected to the second resistance 2 through the second interconnection structure VR. The n-channel and p-channel MOS field effect transistors T1 and T2 provide no effect to the operations of the integrated circuit.

When a first input signal to be applied to the first terminal C1 is high level, then the p-channel MOS field effect transistor T3 turns OFF whilst the n-channel MOS field effect transistor T4 turns ON whereby an output terminal C4 is conductive to the first interconnection structure GND. As a result, a low level output signal appears on the output terminal C4 regardless of second and third input signals to be inputted into the second and third input terminals C2 and C3.

Also if a third input signal to be applied to the third terminal C3 is high level, then the p-channel MOS field effect transistor T5 turns OFF whilst the n-channel MOS field effect transistor T6 turns ON and also the n-channel MOS field effect transistor T6 is kept in ON state whereby the output terminal C4 is conductive to the first interconnection structure GND. As a result, a low level output signal appears on the output terminal C4 regardless of the first and second input signals to be inputted into the first and second input terminals C1 and C2.

If the first and third input signals to be inputted into the first and third input terminals are the low level, then the p-channel MOS field effect transistor T1 is kept in ON state and the p-channel MOS field effect transistors T3 and T5 turn ON whilst the n-channel MOS field effect transistors T4 and T6 turn OFF whereby the output terminal C4 is conductive to the high voltage line Vcc. As a result, the high level signal appears on the output terminal C4.

From the above descriptions, the integrated circuits A1–An serve as two-input OR gates.

If the second input signal to be inputted into the second input terminal is high level, then an output signal from the invertor 3 is low level whereby the n-channel MOS field effect transistor T8 turns OFF. As a result, ON/OFF operations of the n-channel MOS field effect transistor T9 provide no effect to the operations of the integrated circuit.

If the second input signal to be inputted into the second input terminal C2 is low level whilst the third input signal to be inputted into the third input terminal C3 is high level, then the n-channel MOS field effect transistors T6 and T9 turn ON concurrently whereby the majority of the current flows through the n-channel MOS field effect transistor T6. Namely, if the second input signal to be inputted into the second input terminal C2 is low level, then a logic threshold voltage of the OR gate is dropped where the logic threshold voltage is a threshold voltage of whether the OR gate turns ON or OFF by the third input signal inputted into the third input signal terminal C3.

The following descriptions will focus on the integrated circuits B1–Bm. The descriptions will be made with reference to FIG. 6. Each of the integrated circuits B1–Bm has an input terminal C5 and an output terminal C6 and also is supplied with a power through a second interconnection structure VR. The each logic circuit has an invertor 6 with an output terminal connected to the output terminal C6. The each logic circuit has an EXOR gate 5 with an output terminal connected to an input terminal of the invertor 6. The input terminal C5 is connected to one of input terminals of the EXOR gate 5. The each logic circuit has an invertor 4 with an output terminal connected to the other one of the input terminals of the EXOR gate 5. An input terminal of the invertor 4 is connected to the second resistance 2 through the second interconnection structure VR. The invertor 4 has MOS field effect transistors. The second resistance 2 prevents the gate breakdown of the MOS field effect transistors in the invertor 4.

The following descriptions will focus on the operations of the above integrated circuits B1–Bm. Since the input terminal of the invertor 4 is connected to the second resistance 2 through the second interconnection structure VR, then the output signal from the invertor 4 is kept in low level. The output signal from the invertor 4 is inputted into the one input terminal of the EXOR gate 5. As a result, the one input terminal of the EXOR gate 5 is kept to receive the low level signal, for which reason the output signal from the EXOR gate 5 depends upon the signal inputted to the input terminal C5. Namely, if the input signal inputted through the input terminal C5 is low level, then the output signal from the EXOR gate 5 is high level. If, however, the input signal inputted through the input terminal CS is high level, then the output signal from the EXOR gate 5 is low level. The output terminal of the EXOR gate 5 is connected through the invertor 6 to the output terminal C6. Therefore, if the input signal inputted through the input terminal C5 is low level, the low level output signal appears on the output terminal C6. If, however, the input signal inputted through the input terminal C5 is high level, the high level output signal appears on the output terminal C6. Namely, the integrated circuits B1–Bm serve as buffer circuits.

As described above, the first and second interconnection structures GR and VR enable the single first resistance 1 and the single second resistance 2 to prevent the gate breakdown of the field effect transistors in the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

Figure 7:
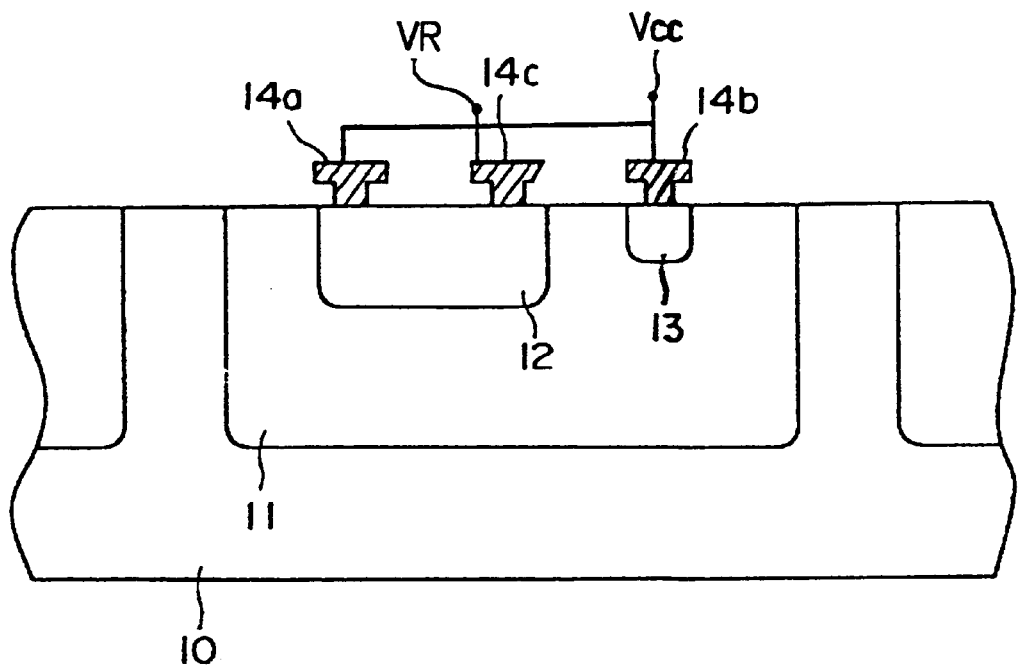
FIG. 7 is a fragmentary cross sectional elevation view illustrative of the second resistance formed in the semiconductor substrate and also connected between the second interconnection structure and the high voltage line in a first embodiment in accordance with the present invention.

FIG. 7 is a fragmentary cross sectional elevation view illustrative of the second resistance formed in the semiconductor substrate and also connected between the second interconnection structure and the high voltage line. The second resistance 2 comprises a diffusion resistance as illustrated in FIG. 7. An n-type well 11 is selectively formed in a p-type semiconductor substrate 10 by an ion-implantation of n-type impurity or a thermal diffusion of n-type impurity. A p-type well 12 is selectively formed in the p-type well 11 by an ion-implantation of n-type impurity or a thermal diffusion of p-type impurity. An n-type well 13 having a higher impurity concentration than the n-type well 11 is selectively formed in the n-type well 11 so that the n-type well 13 is separated from the p-type well 12. A first electrode 14a made of aluminum is formed on the p-type well 12. A second electrode 14b made of aluminum is formed on the n-type well 13. A third electrode 14c made of aluminum is also formed on the p-type well 12 but spaced from the first electrode 14a. The first electrode 14a connected to the high voltage line Vcc is connected through the p-type well 12 to the third electrode 14c connected to the second interconnection structure VR connected to the gates of the MOS field effect transistors. The second electrode 14b is also connected to the high voltage line Vcc. The third electrode 14c is connected to the second interconnection structure VR which is connected to the gates of the MOS field effect transistors. The p-type well 12 serves as the second resistance 2. Namely, the second interconnection structure VR connected to the gates of the MOS field effect transistors is connected through the second resistance 2 to the high voltage line Vcc.

Figure 15:
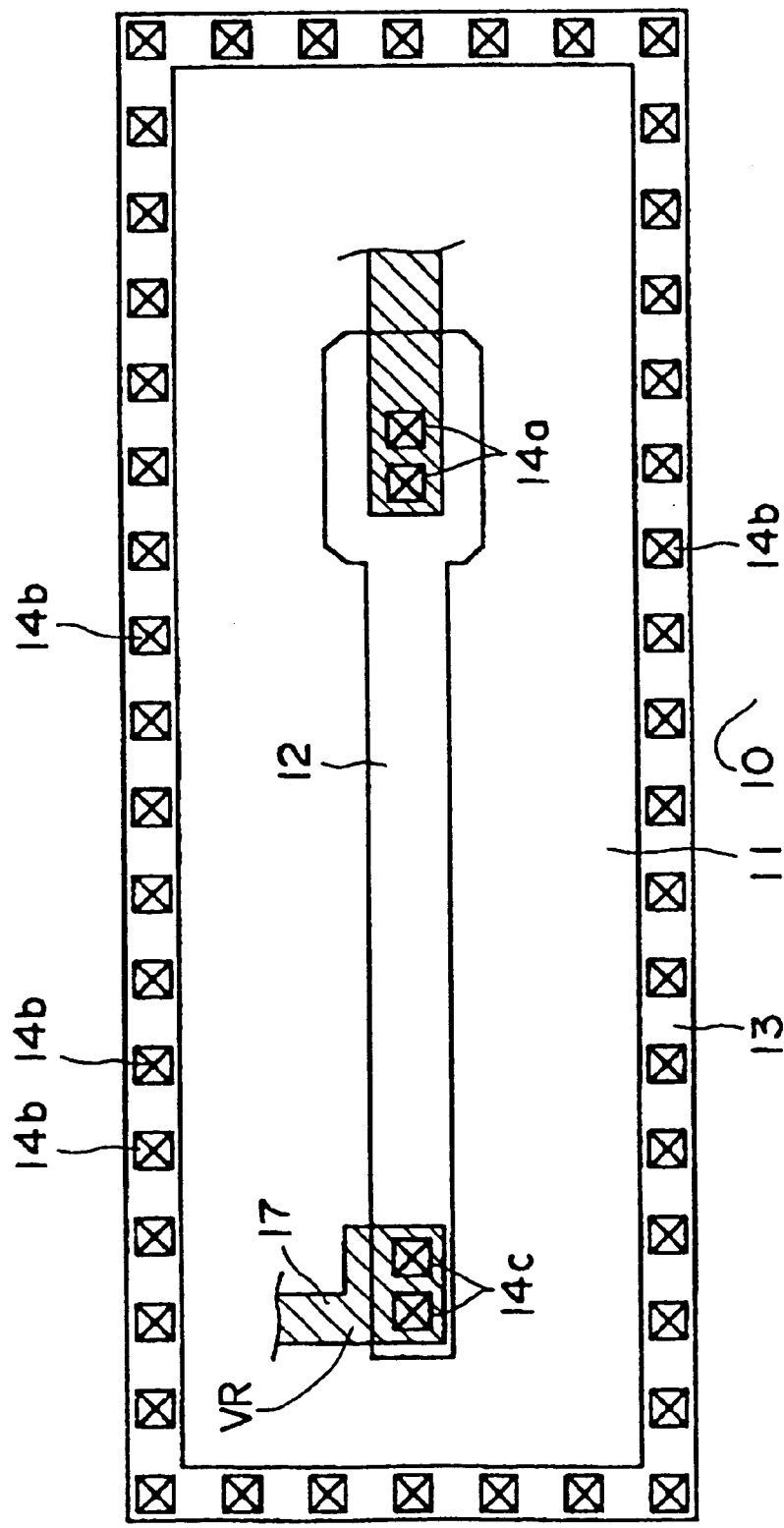
FIG. 15 is a plane view of the second resistance formed in the semiconductor substrate and also connected between the second interconnection structure and the high voltage line in FIG. 7.

FIG. 15 is a plane view of the second resistance formed in the semiconductor substrate and also connected between the second interconnection structure and the high voltage line in FIG. 7. The n-type well 13 is formed to extend on a peripheral region of the n-type well 11 formed in the p-type semiconductor substrate 10. The second electrodes 14b are arranged on the n-type well 13 which extends on a peripheral region of the n-type well 11. The p-type well 12 is formed to extend a longitudinal center axis of the n-type well 11. The first and third electrodes 14a and 14c are formed at opposite ends of the p-type well 12. The third electrodes 14c are connected through a line 17 to the gates of the MOS field effect transistors. The first electrodes 14a are connected to the high voltage line Vcc.

Figure 8:
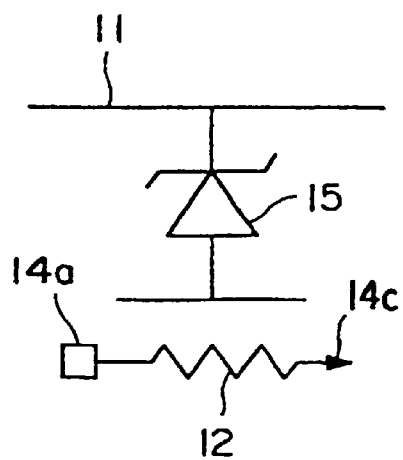
FIG. 8 is a circuit diagram of FIG. 7.

FIG. 8 is a circuit diagram of FIG. 7. The third electrode 14c connected to the second interconnection structure VR is connected through the resistance 12 to the first electrode 14a connected to the high voltage line Vcc. A diode 15 is formed between the n-type well 11 and the p-type well 12, wherein the n-type well 11 serves as a cathode and the p-type well 12 serves as an anode.

Figure 9:
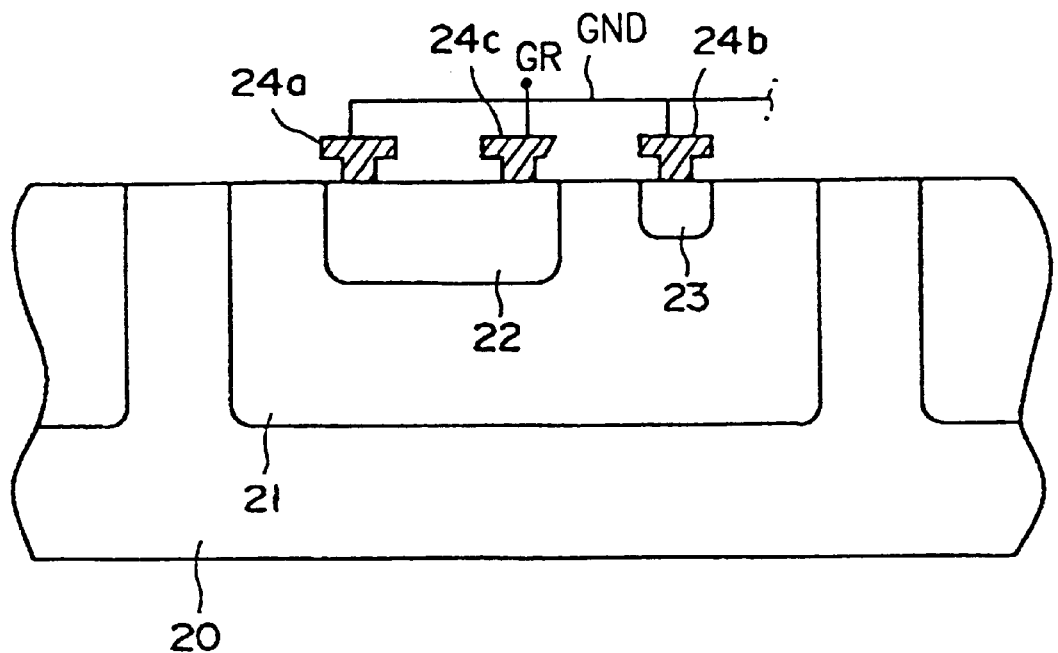
FIG. 9 is a fragmentary cross sectional elevation view illustrative of the first resistance formed in the semiconductor substrate and also connected between the first interconnection structure and the low voltage line in a first embodiment in accordance with the present invention.

FIG. 9 is a fragmentary cross sectional elevation view illustrative of the first resistance formed in the semiconductor substrate and also connected between the first interconnection structure and the ground line. The first resistance 1 comprises a diffusion resistance as illustrated in FIG. 9. A p-type well 21 is selectively formed in an n-type semiconductor substrate 20 by an ion-implantation of p-type impurity or a thermal diffusion of p-type impurity. An n-type well 22 is selectively formed in the p-type well 21 by an ion-implantation of n-type impurity or a thermal diffusion of n-type impurity. A p-type well 23 having a higher impurity concentration than the p-type well 21 is selectively formed in the p-type well 21 so that the p-type well 23 is separated from the n-type well 22. A first electrode 24a made of aluminum is formed on the n-type well 22. A second electrode 24b made of aluminum is formed on the p-type well 23. A third electrode 24c made of aluminum is also formed on the n-type well 22 but spaced from the first electrode 24a. The first electrode 24a connected to the ground line GND is connected through the n-type well 22 to the third electrode 24c connected to the first interconnection structure GR connected to the gates of the MOS field effect transistors. The second electrode 24b is also connected to the ground line GND. The third electrode 24c is connected to the first interconnection structure GR which is connected to the gates of the MOS field effect transistors. The n-type well 22 serves as the first resistance 1. Namely, the first interconnection structure GR connected to the gates of the MOS field effect transistors is connected through the first resistance 1 to the ground line GND.

Figure 10:
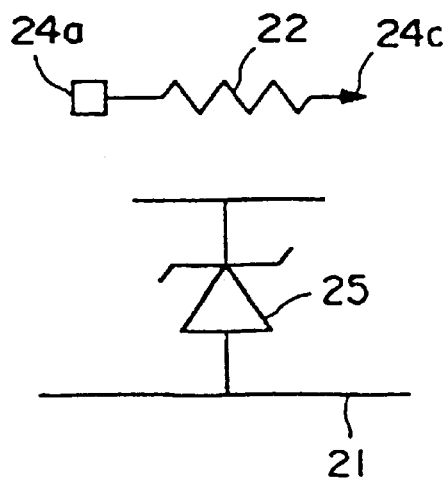
FIG. 10 is a circuit diagram of FIG. 9.

FIG. 10 is a circuit diagram of FIG. 9. The third electrode 24c connected to the first interconnection structure GR is connected through the resistance 22 to the first electrode 24a connected to the ground line GND. A diode 25 is formed between the p-type well 21 and the n-type well 22, wherein the p-type well 21 serves as an anode and the n-type well 22 serves as a cathode.

SECOND EMBODIMENT

A second embodiment according to the present invention will be described with reference to FIGS. 4, 5, 6, 11, 12, 13 and 14. A novel semiconductor integrated circuit in a second embodiment according to the present invention comprises logic circuits A1–An and B1–Bm, each of which has a plurality of field effect transistors with gates connected to a high voltage line Vcc and field effect transistors with other gates connected to a ground line GND. The gates of the logic circuits A1–An and B1–Bm are commonly connected through a first interconnection structure GR to a first resistance 1 which is connected to the ground line GND. The other gates of the logic circuits A1–An and B1–Bm are also commonly connected through a second interconnection structure VR to a second resistance 2 which is connected to the high voltage line Vcc. A power is supplied through the high voltage line Vcc to the individual logic circuits A1–An and B1–Bm. The first and second interconnection structures GR and VR enable the single first resistance 1 and the single second resistance 2 to prevent the gate breakdown of the field effect transistors in the plurality of the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

FIG. 5 is a circuit diagram of each of the logic circuits A1–An in FIG. 4. The structure and operations of the logic circuits A1–An are the same as in the first embodiment. The descriptions of the structure and operations of the logic circuits A1–An will be omitted.

Figure 6:
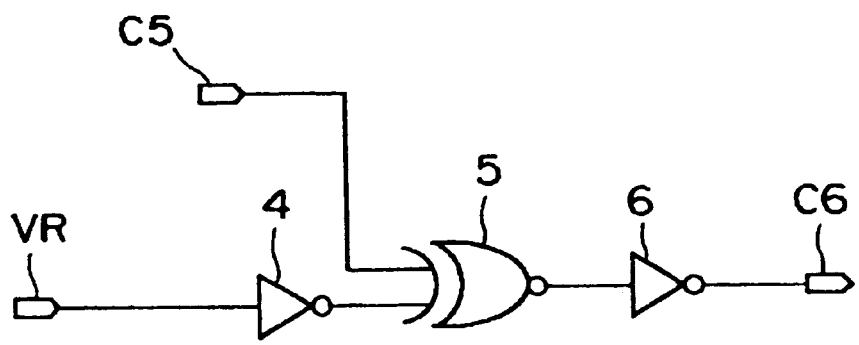
FIG. 6 is a circuit diagram of each of the logic circuits B1–Bm in FIG. 4

FIG. 6 is a circuit diagram of each of the logic circuits B1–Bm in FIG. 4. The structure and operations of the logic circuits B1–Bm are the same as in the first embodiment. The descriptions of the structure and operations of the logic circuits B1–Bm will be omitted.

As described above, the first and second interconnection structures GR and VR enable the single first resistance 1 and the single second resistance 2 to prevent the gate breakdown of the field effect transistors in the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

Figure 11:
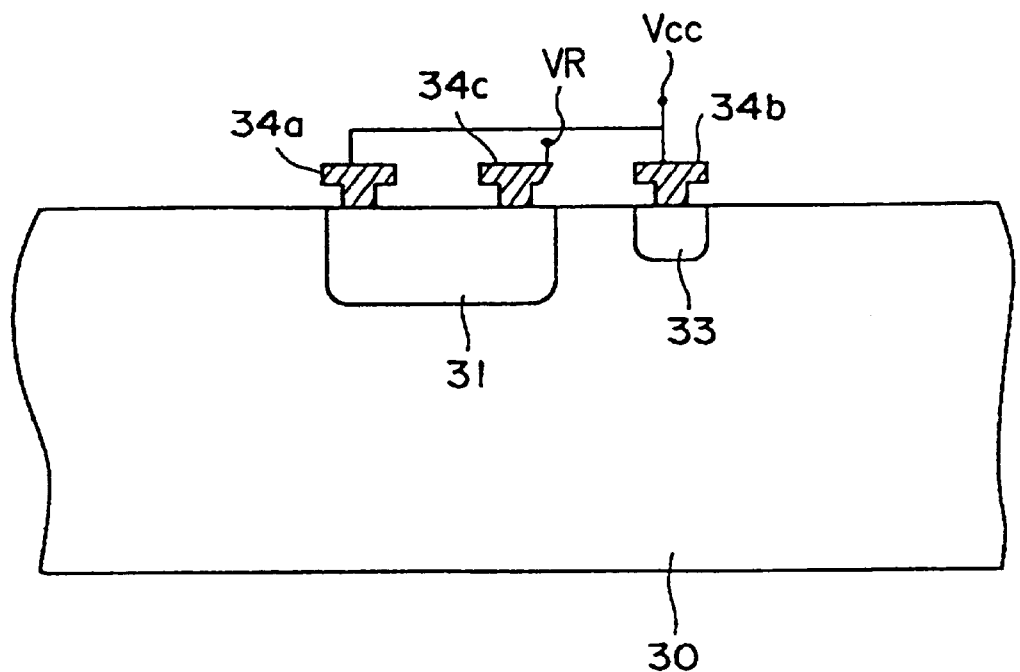
FIG. 11 is a fragmentary cross sectional elevation view illustrative of the second resistance formed in the semiconductor substrate and also connected between the second interconnection structure and the high voltage line.

FIG. 11 is a fragmentary cross sectional elevation view illustrative of the second resistance formed in the semiconductor substrate and also connected between the second interconnection structure and the high voltage line. The second resistance 2 comprises a diffusion resistance as illustrated in FIG. 11. A p-type well 31 is selectively formed in an n-type semiconductor substrate 30 by an ion-implantation of p-type impurity or a thermal diffusion of n-type impurity. An n-type well 33 having a higher impurity concentration than the n-type semiconductor substrate 30 is selectively formed in the semiconductor substrate 30 so that the n-type well 33 is separated from the p-type well 31. A first electrode 34a made of aluminum is formed on the p-type well 31. A second electrode 34b made of aluminum is formed on the n-type well 33. A third electrode 34c made of aluminum is also formed on the p-type well 31 but spaced from the first electrode 34a. The first electrode 34a connected to the high voltage line Vcc is connected through the p-type well 31 to the third electrode 34c connected to the second interconnection structure VR connected to the gates of the MOS field effect transistors. The second electrode 34b is also connected to the high voltage line Vcc. The third electrode 34c is connected to the second interconnection structure VR which is connected to the gates of the MOS field effect transistors. The p-type well 31 serves as the second resistance 2. Namely, the second interconnection structure VR connected to the gates of the MOS field effect transistors is connected through the second resistance 2 to the high voltage line Vcc.

Figure 12:
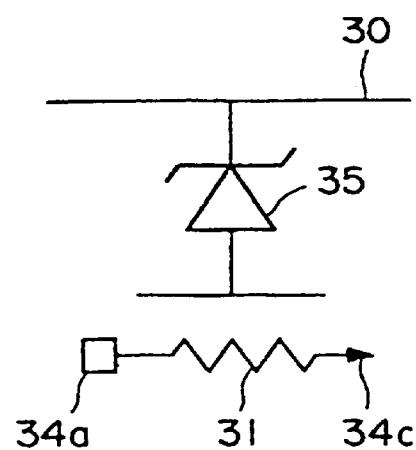
FIG. 12 is a circuit diagram of FIG. 11

FIG. 12 is a circuit diagram of FIG. 11. The third electrode 34c connected to the second interconnection structure VR is connected through the resistance 31 to the first electrode 34a connected to the high voltage line Vcc. A diode 35 is formed between the n-type semiconductor substrate 30 and the p-type well 31, wherein the semiconductor substrate 30 serves as a cathode and the p-type well 31 serves as an anode.

Figure 13:
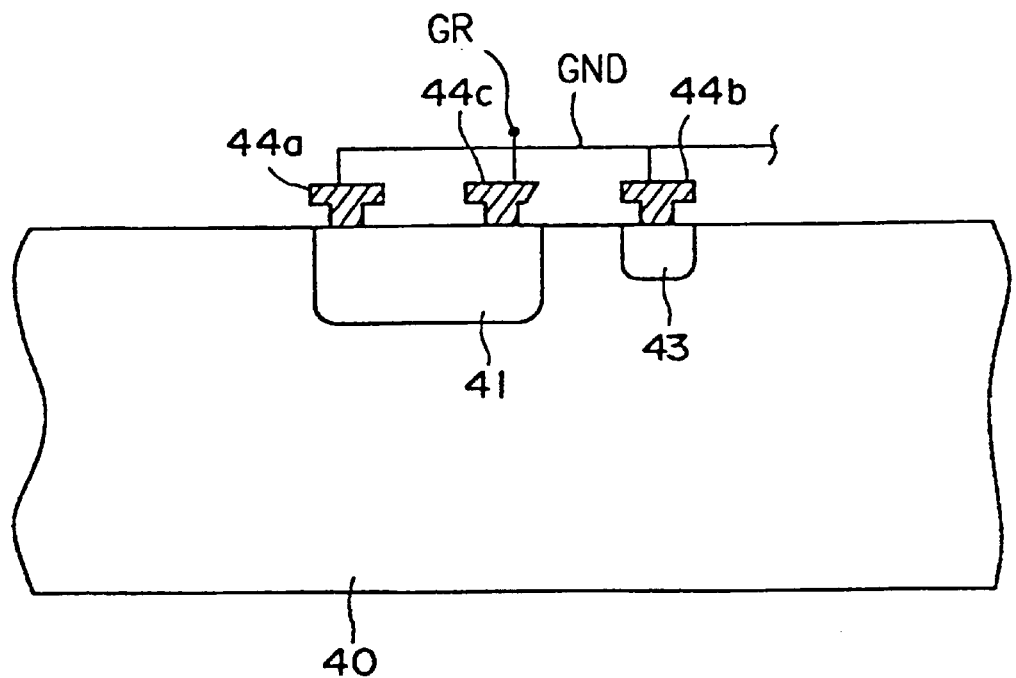
FIG. 13 is a fragmentary cross sectional elevation view illustrative of the first resistance formed in the semiconductor substrate and also connected between the first interconnection structure and the ground line.

FIG. 13 is a fragmentary cross sectional elevation view illustrative of the first resistance formed in the semiconductor substrate and also connected between the first interconnection structure and the ground line. The first resistance 1 comprises a diffusion resistance as illustrated in FIG. 13. An n-type well 41 is selectively formed in a p-type semiconductor substrate 40 by an ion-implantation of n-type impurity or a thermal diffusion of n-type impurity. A p-type well 43 having a higher impurity concentration than the p-type semiconductor substrate 40 is selectively formed in the p-type semiconductor substrate 40 so that the p-type well 43 is separated from the n-type well 41. A first electrode 44a made of aluminum is formed on the n-type well 41. A second electrode 44b made of aluminum is formed on the p-type well 43. A third electrode 44c made of aluminum is also formed on the n-type well 41 but spaced from the first electrode 44a. The first electrode 44a connected to the ground line GND is connected through the n-type well 41 to the third electrode 44c connected to the first interconnection structure GR connected to the gates of the MOS field effect transistors. The second electrode 44b is also connected to the ground line GND. The third electrode 44c is connected to the first interconnection structure GR which is connected to the gates of the MOS field effect transistors. The n-type well 41 serves as the first resistance 1. Namely, the first interconnection structure GR connected to the gates of the MOS field effect transistors is connected through the first resistance 1 to the ground line GND.

Figure 14:
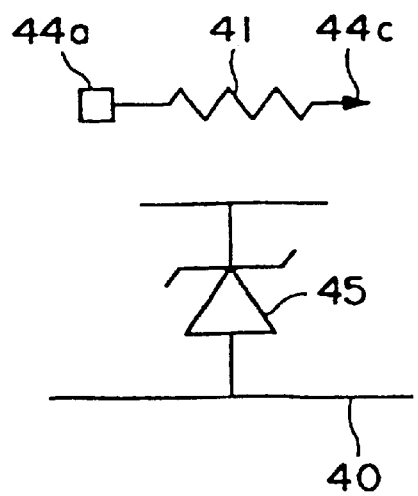
FIG. 14 is a circuit diagram of FIG. 13.

FIG. 14 is a circuit diagram of FIG. 13. The third electrode 44c connected to the first interconnection structure GR is connected through the resistance 41 to the first electrode 44a connected to the ground line GND. A diode 45 is formed between the p-type semiconductor substrate 40 and the n-type well 41, wherein the p-type semiconductor substrate 40 serves as an anode and the n-type well 41 serves as a cathode.

THIRD EMBODIMENT

A third embodiment according to the present invention will be described with reference to FIGS. 4, 5, 6, 16 and 17. A novel semiconductor integrated circuit in a third embodiment according to the present invention comprises logic circuits A1–An and B1–Bm, each of which has a plurality of field effect transistors with gates connected to a high voltage line Vcc and field effect transistors with other gates connected to a ground line GND. The gates of the logic circuits A1–An and B1–Bm are commonly connected through a first interconnection structure GR to a first resistance 1 which is connected to the ground line GND. The other gates of the logic circuits A1–An and B1–Bm are also commonly connected through a second interconnection structure VR to a second resistance 2 which is connected to the high voltage line Vcc. A power is supplied through the high voltage line Vcc to the individual logic circuits A1–An and B1–Bm. The first and second interconnection structures GR and VR enable the single first resistance 1 and the single second resistance 2 to prevent the gate breakdown of the field effect transistors in the plurality of the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

FIG. 5 is a circuit diagram of each of the logic circuits A1–An in FIG. 4. The structure and operations of the logic circuits A1–An are the same as in the first embodiment. The descriptions of the structure and operations of the logic circuits A1–An will be omitted.

FIG. 6 is a circuit diagram of each of the logic circuits B1–Bm in FIG. 4. The structure and operations of the logic circuits B1–Bm are the same as in the first embodiment. The descriptions of the structure and operations of the logic circuits B1–Bm will be omitted.

As described above, the first and second interconnection structures GR and VR enable the single first resistance 1 and the single second resistance 2 to prevent the gate breakdown of the field effect transistors in the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

Figure 16:
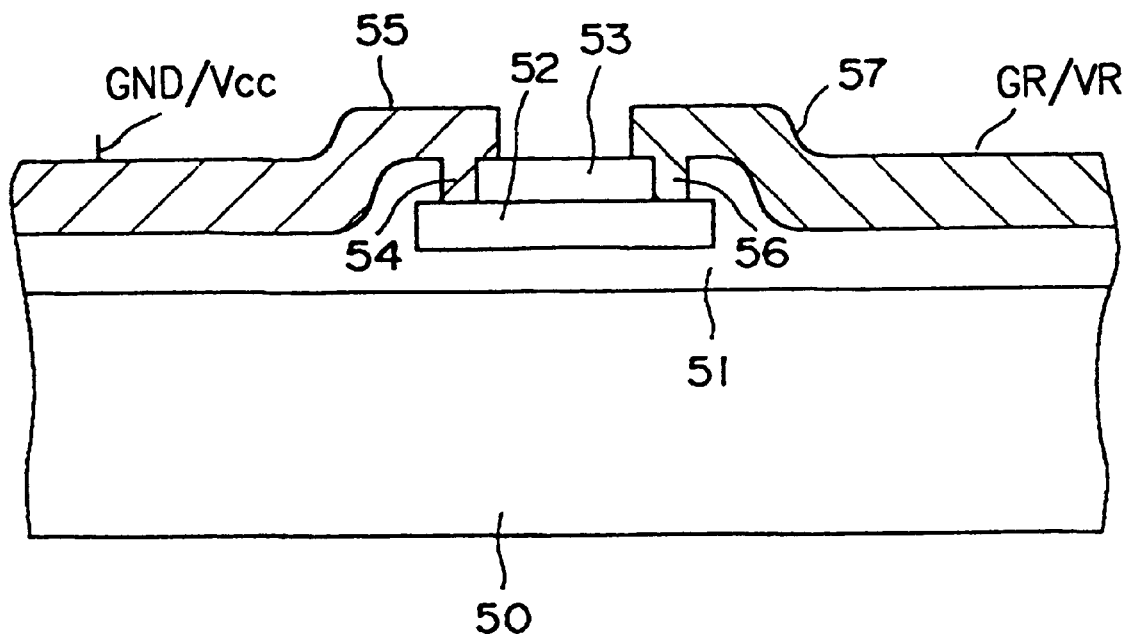
FIG. 16 is a fragmentary cross sectional elevation view illustrative of the first or second resistances formed in the semiconductor substrate and also connected between the first or second interconnection structure and the ground line or high voltage line in a third embodiment according to the present invention.
Figure 17:
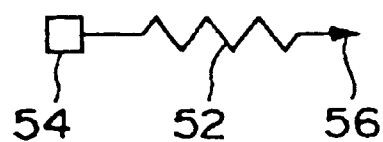
FIG. 17 is a circuit diagram of FIG. 16.
Figure 20:
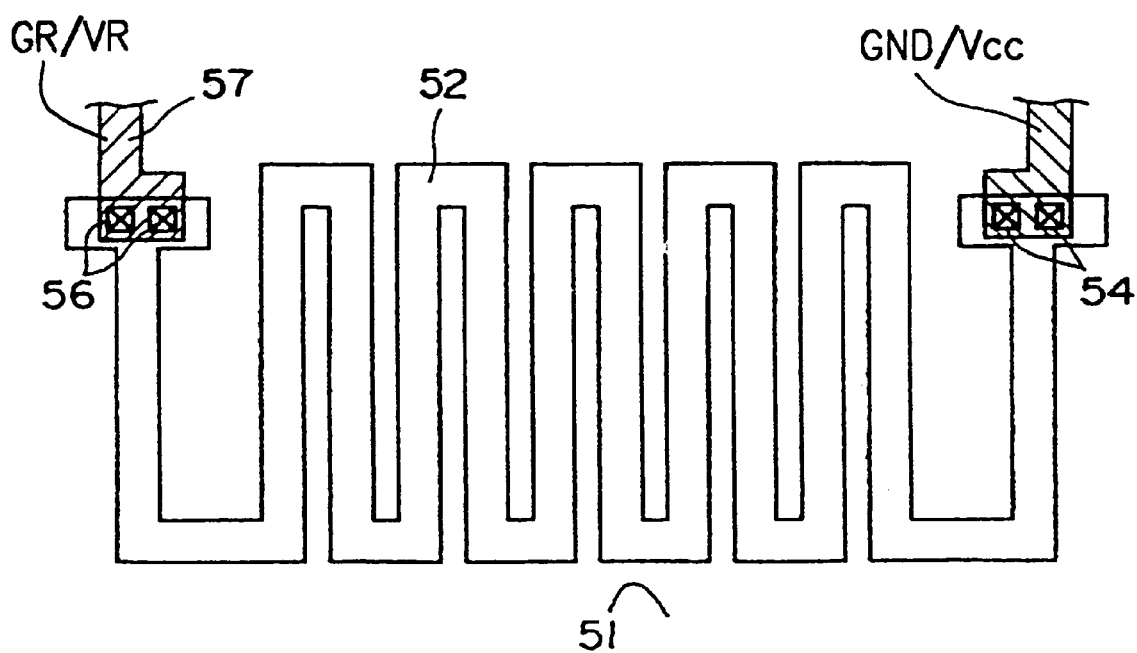
FIG. 20 is a plane view of the first or second resistance formed in the semiconductor substrate and also connected between the first or second interconnection structure and the ground or high voltage line in FIG. 16.

FIG. 16 is a fragmentary cross sectional elevation view illustrative of the first or second resistances formed in the semiconductor substrate and also connected between the first or second interconnection structure and the ground line or high voltage line. Each of the first and second resistance 1 and 2 comprises a polysilicon resistance as illustrated in FIG. 16. FIG. 20 is a plane view of the first or second resistances of FIG. 16. FIG. 17 is a circuit diagram of FIG. 16. A silicon oxide film 51 is formed on a surface of a p-type semiconductor substrate 50. A polysilicon layer 52 which serves as the first or second resistance 1 or 2 is selectively formed on the silicon oxide film 51. A silicon oxide film 53 is provided which covers the polysilicon layer 52. An aluminum interconnection 55 is connected through a first contact hole 54 to the polysilicon layer 52. The aluminum interconnection 55 is also connected to the ground line GND or the high voltage line Vcc. An aluminum interconnection 57 is connected through a second contact hole 56 to the polysilicon layer 52. The aluminum interconnection 57 is also connected to the first or second interconnection structure GB or VR connected to the gates of the MOS field effect transistors. The aluminum interconnection 55 connected to the ground line GND or the high voltage line Vcc is therefore connected through the polysilicon layer 52 to the aluminum interconnection 57 connected to the first or second interconnection structure GB or VR. Accordingly, the first or second interconnection structure GB or VR connected to the gates of the MOS field effect transistors is connected through the polysilicon layer 52 serving as the first or second resistance 1 or 2 to the ground line GND or the high voltage line Vcc.

FOURTH EMBODIMENT

A fourth embodiment according to the present invention will be described with reference to FIGS. 4, 5, 6, 18 and 19. A novel semiconductor integrated circuit in a fourth embodiment according to the present invention comprises logic circuits A1–An and B1–Bm, each of which has a plurality of field effect transistors with gates connected to a high voltage line Vcc and field effect transistors with other gates connected to a ground line GND. The gates of the logic circuits A1–An and B1–Bm are commonly connected through a first interconnection structure GR to a first resistance 1 which is connected to the ground line GND. The other gates of the logic circuits A1–An and B1–Bm are also commonly connected through a second interconnection structure VR to a second resistance 2 which is connected to the high voltage line Vcc. A power is supplied through the high voltage line Vcc to the individual logic circuits A1–An and B1–Bm. The first and second interconnection structures GR and VR enable the single first resistance 1 and the single second resistance 2 to prevent the gate breakdown of the field effect transistors in the plurality of the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

FIG. 5 is a circuit diagram of each of the logic circuits A1–An in FIG. 4. The structure and operations of the logic circuits A1–An are the same as in the first embodiment. The descriptions of the structure and operations of the logic circuits A1–An will be omitted.

FIG. 6 is a circuit diagram of each of the logic circuits B1–Bm in FIG. 4. The structure and operations of the logic circuits B1–Bm are the same as in the first embodiment. The descriptions of the structure and operations of the logic circuits B1–Bm will be omitted.

As described above, the first and second interconnection structures GR and VR enable the single first resistance 1 and the single second resistance 2 to prevent the gate breakdown of the field effect transistors in the logic circuits A1–An and B1–Bm. The semiconductor integrated circuit needs a small area for placement of only the two resistances or the first and second resistances 1 and 2 in order to prevent the breakdown of the gates of all of the plural logic circuits A1–An and B1–Bm.

Figure 18:
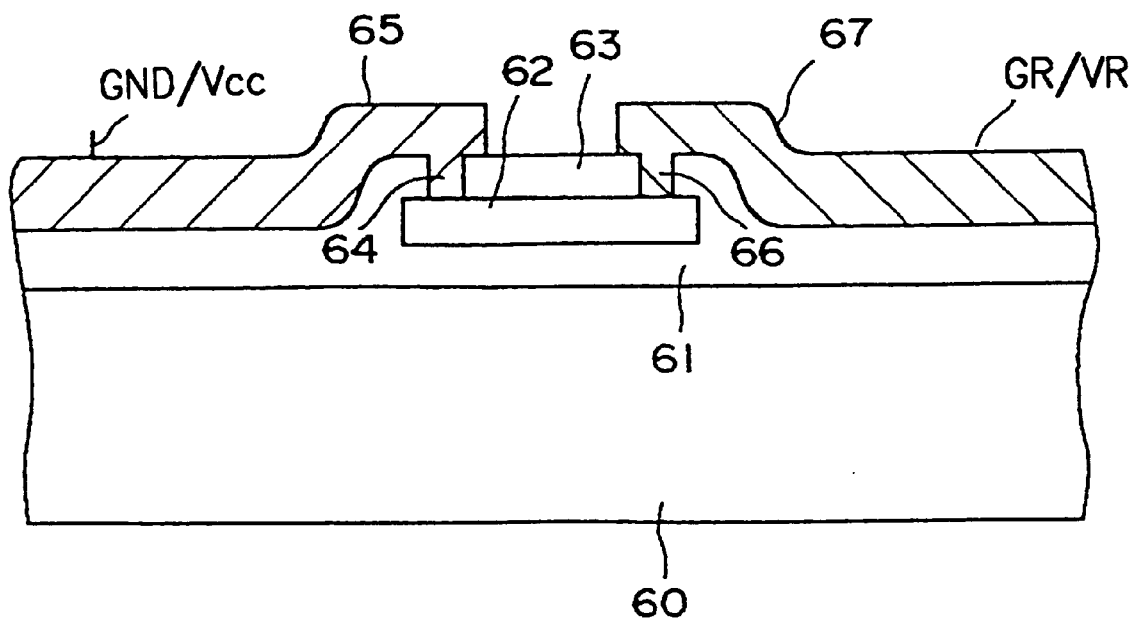
FIG. 18 is a fragmentary cross sectional elevation view illustrative of the first or second resistances formed in the semiconductor substrate and also connected between the first or second interconnection structure and the ground line or high voltage line in a fourth embodiment according to the present invention.
Figure 19:
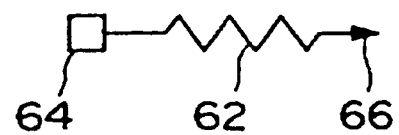
FIG. 19 is a circuit diagram of FIG. 18.

FIG. 18 is a fragmentary cross sectional elevation view illustrative of the first or second resistances formed in the semiconductor substrate and also connected between the first or second interconnection structure and the ground line or high voltage line. Each of the first and second resistance 1 and 2 comprises a polysilicon resistance as illustrated in FIG. 18. FIG. 19 is a circuit diagram of FIG. 18. A silicon oxide film 61 is formed on a surface of an n-type semiconductor substrate 60. A polysilicon layer 62 which serves as the first or second resistance 1 or 2 is selectively formed on the silicon oxide film 61. A silicon oxide film 63 is provided which covers the polysilicon layer 62. An aluminum interconnection 65 is connected through a first contact hole 64 to the polysilicon layer 62. The aluminum interconnection 65 is also connected to the ground line GND or the high voltage line Vcc. An aluminum interconnection 67 is connected through a second contact hole 66 to the polysilicon layer 62. The aluminum interconnection 67 is also connected to the first or second interconnection structure GB or VR connected to the gates of the MOS field effect transistors. The aluminum interconnection 65 connected to the ground line GND or the high voltage line Vcc is therefore connected through the polysilicon layer 62 to the aluminum interconnection 67 connected to the first or second interconnection structure GB or VR. Accordingly, the first or second interconnection structure GB or VR connected to the gates of the MOS field effect transistors is connected through the polysilicon layer 62 serving as the first or second resistance 1 or 2 to the ground line GND or the high voltage line Vcc.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor integrated circuit comprising a plurality of logic circuits, each of said logic circuits having both at least a first field effect transistor with a first gate connected to a first constant voltage line applied with a ground potential and at least a second field effect transistor with a second gate connected to a second constant voltage line applied with a positive voltage potential;

wherein said first gates of at least two of said plurality of logic circuits are commonly connected through a first interconnection structure to a first resistor which is connected to said first constant voltage line;

wherein said second gates of at least two of said plurality of logic circuits are also commonly connected through a second interconnection structure to a second resistor which is connected to said second constant voltage line;

wherein the first resistor comprises:
  a first p-type well disposed within an n-type semiconductor substrate;
  a first n-type well disposed within the first p-type well;
  a second p-type well disposed within the first p-type well so that the second p-type well is separated from the first n-type well, the second p-type well having an impurity concentration higher than an impurity concentration of the first p-type well; and
  first, second, and third electrodes, the first and third electrodes being electrically connected to the first n-type well, the second electrode being electrically connected to the second p-type well, the first and third electrodes being electrically connected to the first constant voltage line, the second electrode being electrically connected to the first interconnection structure, so that a predetermined electrical resistance is provided between the first constant voltage and the first interconnection structure;
  wherein a diode is formed between the first p-type well and the first n-type well, the first n-type well acting as a cathode and the first p-type well acting as an anode of the diode;

wherein the second resistor comprises:
  a second n-type well disposed with a p-type semiconductor substrate;
  a third p-type well disposed within the second n-type well;
  a third n-type well disposed within the second n-type well so that the third n-type well is separated from the third p-type well, the third n-type well having an impurity concentration higher than an impurity concentration; of the second n-type well; and
  fourth, fifth, and sixth electrodes, the fourth and sixth electrodes being electrically connected to the third p-type well, the fifth electrode being electrically connected to the third n-type well, the fourth and sixth electrodes being electrically connected to the second constant voltage line, the fifth electrode being electrically connected to the second interconnection structure
  wherein a diode is formed between the second n-type well and the third p-type well, the second n-type well acting as a cathode and the third p-type well acting as an anode of the diode.

2. The semiconductor integrated circuit as claimed in claim 1, wherein said plurality of logic circuits form a plurality of groups and said second interconnection structure is divided into a plurality of second subordinate interconnection structures in correspondence to said plurality of groups as well as said second resistance comprises a plurality of second subordinate resistances in correspondence to said plurality of second subordinate interconnection structures which are connected in parallel to said second constant voltage line, so that said second gates of said logic circuits in each of said plurality of groups are commonly connected through a corresponding one of said plurality of second subordinate interconnection structures to a corresponding one of said plurality of second subordinate resistances.

3. The semiconductor integrated circuit as claimed in claim 1, wherein said plurality of logic circuits form a plurality of groups and said first interconnection structure is divided into a plurality of first subordinate interconnection structures in correspondence to said plurality of groups as well as said first resistance comprises a plurality of first subordinate resistances in correspondence to said plurality of first subordinate interconnection structures which are connected in parallel to said first constant voltage line, so that said first gates of said logic circuits in each of said plurality of groups are commonly connected through a corresponding one of said plurality of first subordinate interconnection structures to a corresponding one of said plurality of first subordinate resistances.

* * * * *